(12) United States Patent
Joyce

(10) Patent No.: US 6,278,721 B1
(45) Date of Patent: Aug. 21, 2001

(54) METHOD FOR MINIMIZING LOCKING RANGE VARIABILITY OF A LASER MODULE

(75) Inventor: William B. Joyce, Basking Ridge, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/261,530

(22) Filed: Mar. 3, 1999

(51) Int. Cl.[7] .......................................... H01S 3/08
(52) U.S. Cl. ............................. 372/102; 372/32
(58) Field of Search ........................ 372/102, 32

(56) References Cited

U.S. PATENT DOCUMENTS

| | | |
|---|---|---|
| 4,786,132 | 11/1988 | Gordon . |
| 5,715,263 * | 2/1998 | Ventrudo .................. 372/6 |
| 5,717,711 | 2/1998 | Doussiere et al. . |
| 5,717,804 | 2/1998 | Pan et al. . |
| 5,724,377 | 3/1998 | Huang . |
| 5,740,191 * | 4/1998 | Kasper .................... 372/34 |
| 5,805,621 | 9/1998 | Grubb et al. . |
| 5,870,417 * | 2/1999 | Verdiell .................. 372/32 |
| 6,049,073 * | 4/2000 | Roddy ................... 250/205 |
| 6,101,210 * | 8/2000 | Bestwick ................ 372/96 |

* cited by examiner

Primary Examiner—Teresa M. Arroyo
Assistant Examiner—Gioacchino Inzirillo
(74) Attorney, Agent, or Firm—J. De La Rosa

(57) ABSTRACT

The present invention discloses a method for eliminating, or at least minimizing, the locking range variability of laser modules which employ external grating, such as fiber bragg gratings. It has been observed that the coupling efficiency between the laser and its output fiber is a highly variable property of the laser module, causing variations in the laser module's locking range. The laser module's locking range, however, can be readily reset to or near its nominal value by measuring the laser module's coupling efficiency, and then judiciously choosing a grating having a peak reflectivity which compensates for variations in the coupling efficiency by maintaining constant the effective reflectivity $R_{eff}$ of the fiber/grating combination.

24 Claims, 1 Drawing Sheet

METHOD FOR MINIMIZING LOCKING RANGE VARIABILITY OF A LASER MODULE

TECHNICAL FIELD

The present invention relates to laser modules and, more particularly, to laser modules which employ external gratings to stabilize lasing.

BACKGROUND OF THE INVENTION

Lightwave communication systems strive for maximum transmission capacity by spacing optical channels as closely as possible, typically a few nanometers or less. However, any drift in the lasing wavelength readily causes the signals from one optical channel to cross into another. As such, lightwave communication systems typically use laser modules which employ external gratings to stabilize the lasing wavelength at a desired value. In this latter case, although the laser housed in the module resonates over a range of wavelengths, the external grating confines or so-called "locks" the laser to operate at a single desired wavelength. This arrangement has the additional benefit that the linewidth of the laser's output is narrowed considerably after passing through the grating.

The above locking mechanism, however, only works over a particular range in temperatures, known as the laser module's "locking range." Traditionally, this locking range is designed to match the span in temperatures for the desired application. It has been observed that the locking range, however, varies from one module to another. Accordingly, it would be desirable to provide for a method to eliminate, or at least minimize, the variations in the locking range of such laser modules.

SUMMARY OF THE INVENTION

The present invention discloses a method for eliminating, or at least minimizing, the locking range variability of laser modules which employ external gratings, such as fiber bragg gratings. It has been observed that the coupling efficiency between the laser and its output fiber is a highly variable property of the laser module, causing variations in the laser module's locking range. The laser module's locking range, however, can be readily reset to or near its nominal value by measuring the laser module's coupling efficiency, and then judiciously choosing a grating having a peak reflectivity which compensates for variations in the coupling efficiency by maintaining constant the effective reflectivity $R_{eff}$ of the fiber/grating combination. In this latter manner, the fraction of the light coupled back into the laser cavity is substantially maintained constant from module to module, minimizing locking range variability. Preferably, fiber bragg gratings of different known peak reflectivity values can be readily fabricated, kept in inventory, and then judiciously chosen depending on the measured coupling efficiency, C.

BRIEF DESCRIPTION OF THE DRAWINGS

The features and advantages of the present invention will become more readily apparent from the following detailed description of the invention in which like elements are labeled similarly and in which.

DETAILED DESCRIPTION

The present invention is directed to a method for eliminating, or at least minimizing, the locking range variability of laser modules which employ external gratings to stabilize their lasing wavelengths at a desired value. More particularly, the method affords the ability to readily adjust the laser module's locking range so as to account for variations in the coupling efficiency between the laser and its receiving or output fiber. Laser modules which employ external fiber bragg gratings to provide narrow linewidth, wavelength stable light particularly benefit from the present inventive method.

More specifically, it has been discovered that the coupling efficiency between the laser and its output fiber is a highly variable property of the laser module. As such, the fraction of light coupled into the lasing modes of the laser likewise becomes variable, causing variations in the laser module's locking range. In accordance with principles of the invention, the laser module's locking range, however, can be readily reset to or near its nominal value by measuring the laser module's coupling efficiency, and then judiciously choosing a grating having a peak reflectivity at or near a desired value that substantially compensates for variations in the coupling efficiency. In this manner, the fraction of the light coupled back into the cavity of the laser is substantially maintained constant, minimizing locking range variability.

Without any loss of generality or applicability for the principles of the invention, the present inventive method is described with respect to a laser module employing an external fiber bragg grating. It should be clearly understood, however, that the present invention is equally applicable to laser modules employing other types of external gratings.

Figure 1:
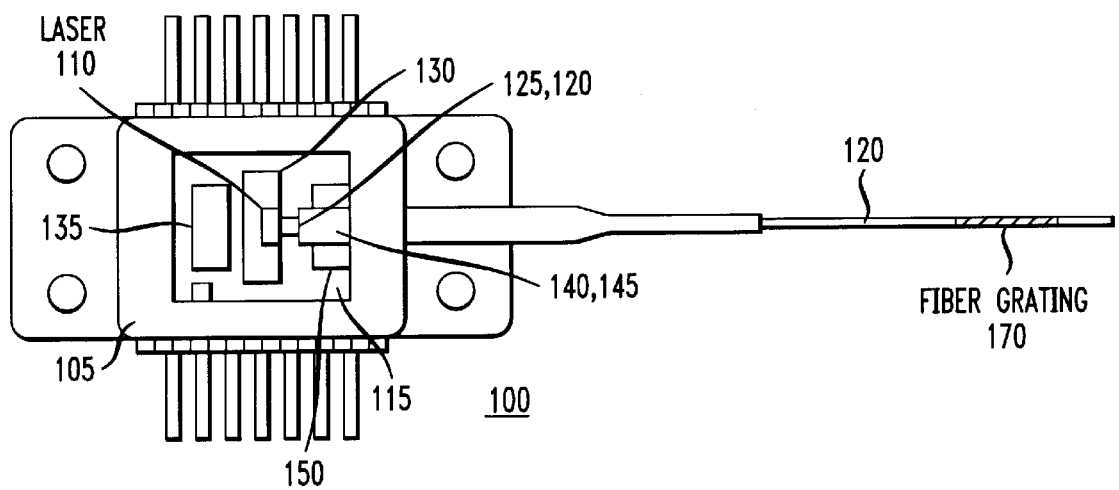
FIGS. 1 and 2 show a plan view and a simplified cut-away view, respectively, of a laser module useful in discussing the principles of the present inventive method.
Figure 2:
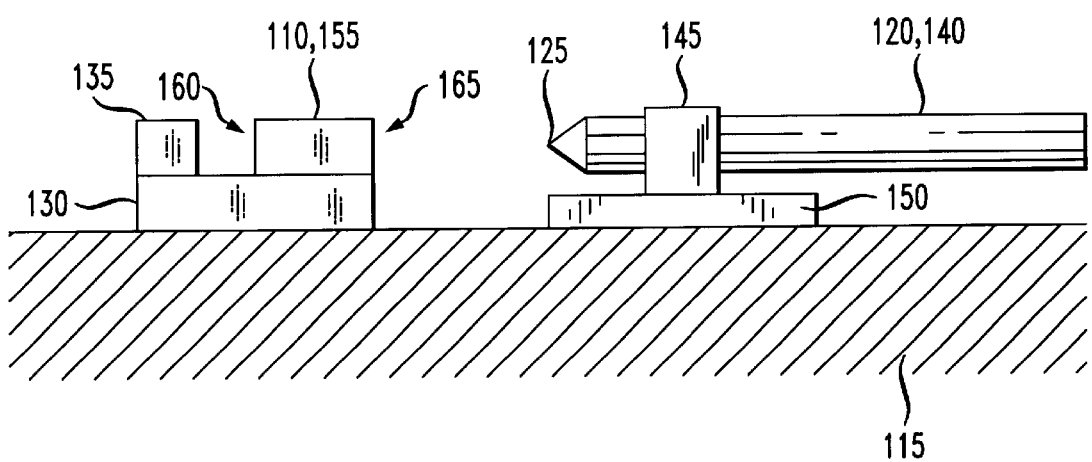

Referring to FIGS. 1–2, there is shown a laser module 100 comprising a "14-pin butterfly" housing 105 configured to contain a semiconductor laser 110 that emits coherent light. Housing 105 includes an opening along its top side for providing access to the interior, and an assembly platform 115. There is an opening at an end sidewall of housing 105 for allowing the passage of a pigtail fiber 120 into the interior, with preferably a lens 125, such as a micro-lens, coupling the light emitted from laser 110 into fiber 120.

Laser 110 is supported on a carrier 130, and in turn, the carrier is attached to assembly platform 115. A photodetector 135 may also be disposed on carrier 130 to monitor the optical power from the back facet of laser 110. Pigtail fiber 120 is held within a metal ferrule 140 which extends through the opening to the exterior of housing 105. Alignment between fiber 120 and laser 110 is maintained, for example, by a clip 145 which is welded to ferrule 140 as well as to a carrier 150, which in turn is soldered to assembly platform 115.

Laser 110 is a Fabry-Perot type laser having a gain medium 155 disposed between a pair of end facets 160, 165. Back facet 160 is a conventional cleaved facet which has been coated to have nearly a 100% reflectivity, e.g., 95%. Contrastingly, front facet 165 is anti-reflection (AR) coated to achieve a reflectivity of only a few percent, typically 1–5%. An outside source, such as an applied current, is used to excite electrons of gain medium 155, causing them to release light which then reflects back and forth between the mirrors. Different wavelengths resonate between facets 160, 165, with a portion of the light egressing from front facet 165.

To stabilize lasing, a fiber bragg grating 170 is spliced to pigtail fiber 120, and consists of a periodic variation in the refractive index of the fiber's core, which variation has been denoted by heavy marks. See, for example, *Lightwave Applications of Fibre Bragg Gratings, IEEE Journal of Lightwave Technology,* Vol. 15, No. 8, August 1997, pp.

1391–1404. In effect, the cavity of the laser now extends to grating 170 which forms one of the laser's end facets. In conventional practice, fiber bragg grating 170 is designed to reflect back into the laser cavity substantially only a single wavelength $\lambda_g$, which substantially coincides with the gain peak wavelength $\lambda_p$ of laser 110 at its nominal operating temperature. Thus, although laser 110 resonates over a range of wavelengths, the laser is confined to operate at or is so-called "locked" to the wavelength $\lambda_g$ since there is substantially less feedback at any other wavelength.

In order for this latter locking mechanism to work, the so-called "grating wavelength" $\lambda_g$ must be substantially close to the gain peak wavelength $\lambda_p$. With variations in the laser's temperature, however, the gain peak wavelength $\lambda_p$ shifts away from the grating wavelength $\lambda_g$, about a few tenths of a nanometer per degree centigrade (nm/° C.). As such, laser module 100 can only operate properly over a temperature range known as the laser module's "locking range."

In conventional practice, laser module 100 is nominally designed such that laser 110 locks over the span in temperatures for the desired application. Traditionally, this is accomplished by setting the grating's peak reflectivity $R_g$ to a desired value, which is comparable or greater than the front facet's reflectivity, typically about 1–10%. In doing so, the amount of light reflected from fiber bragg grating 170 into the laser cavity is made to dominate over that reflected from front facet 165 so as to desirably provide sufficient feedback for the desired span in temperatures. In the fiber/grating combination just described above herein it has been observed that there are, however, two types of mechanism controlling the amount of light coupled back into the laser cavity. One mechanism results from the reflectivity of fiber bragg grating 170, which peaks at the grating wavelength $\lambda_g$ and has a distribution $R(\lambda)$ a few angstrom wide or less.

The other mechanism results from the efficiency of coupling light to and from pigtail fiber 120, which is determined by the mismatch or misalignment in the lasing and propagating modes of the laser and fiber, respectively. For conventional waveguide lasers with lensed fibers, the coupling efficiency, C, is between about 50–80%. Thus, the fraction of egressing light coupled back into the laser cavity or the effective reflectivity $R_{eff}$ of the fiber/grating combination is a function of both the coupling efficiency C and the grating's peak reflectivity, $R_p$. In mathematical terms, the effective reflectivity $R_{eff}$ can be shown to be given by:

$$R_{eff} = C^2 R_p$$

Note that the effective reflectivity $R_{eff}$ is highly dependent on the coupling efficiency C inasmuch as the coupling efficiency acts both on the outbound and return optical paths between laser 110 and fiber bragg grating 170.

It has been observed, however, that the coupling efficiency C is a highly variable property of laser module 100. As a result, the fraction of light egressing from the laser cavity that is coupled back into the cavity also becomes highly variable, thereby causing the laser module's locking range to vary from its nominal value. In accordance with the principles of the invention, the laser module's locking range, however, can be readily adjusted to or near its nominal value by measuring the laser/fiber's coupling efficiency, C, and then judiciously splicing to pigtail fiber 120 a fiber bragg grating having a peak reflectivity $R_p$ that substantially maintains constant the effective reflectivity $R_{eff}$, thereby compensating for variations in the coupling efficiency, C. In this latter manner, the fraction of the light coupled back into the laser cavity is likewise substantially maintained constant from module to module, minimizing locking range variability. As such, fiber bragg gratings of different known peak reflectivities can be readily fabricated by varying the length, depth and period of the grating, kept in inventory for later use, and then chosen depending on the measured coupling efficiency C. Of course, a fiber bragg grating having the exact desired peak reflectivity can be fabricated, but that will usually be more costly.

The above constraint on the effective reflectivity $R_{eff}$ of the fiber/grating combination can be expressed mathematically as follows:

$$R_{p2} = \left(\frac{C_1}{C_2}\right)^2 R_{p1}$$

wherein $C_1$ and $R_{p1}$ are the nominal peak reflectivity and coupling efficiency, respectively, of the laser module which yield the desired locking range; $C_2$ is the measured coupling efficiency of the laser/fiber; and $R_{p2}$ is the desired peak reflectivity of the fiber bragg grating which will compensate for the variation in the coupling efficiency $C_2$ from the nominal coupling efficiency, $C_1$. Note that the desired peak reflectivity $R_{p2}$ increases non-linearly and inversely with the observed coupling efficiency $C_2$.

In an exemplary illustration, laser 110 has been designed in a manner well known in the art to lock over the desired span in temperatures with a peak grating reflectivity $R_{p1}$ of 5% and a nominal coupling efficiency $C_1$ of 70%. The coupling efficiency, however, has been observed to vary anywhere from 50–80%, causing variations in the laser module's locking range. In accordance with the above latter equation, if the coupling efficiency $C_2$ is measured and found to vary from its nominal value of 70% to 65%, then to compensate for this variation a fiber bragg grating having a peak reflectivity of about 5.8% can instead be spliced to pigtail fiber 120 so as to maintain constant the fraction of the light coupled back into the laser cavity, thus yielding the desired locking range.

Preferably, however, an inventory of fiber bragg gratings are kept having a range of different peak reflectivity values. Then, based on the measured coupling efficiency C of each laser module 100, one can be chosen from inventory which has a peak reflectivity closest to the desired value so as to minimize the variability in the laser module's locking range. Preferably, this inventory consists of gratings having peak reflectivity values equally spaced within the reflectivity range required to compensate for the observed variations in the coupling efficiency. In general, increasing the number of different peak reflectivity values decreases the variability in the locking range, but there will usually be a benefit/cost tradeoff.

For example, assume that an inventory of fiber bragg gratings are kept having the following peak reflectivity values between 4–7%: (1) 4%, (2) 4.5% (3) 5%, (4) 5.5%, (5) 6% and (6) 7%. In accordance with the principles of the invention, tabulated below are the gratings chosen to minimize the variability in the laser module's locking range for the variations in the coupling efficiency of the laser modules, ranging between 60–80%.

| Nominal Peak Reflectivity $R_{p1}$ | Nominal Coupling Efficiency $C_1$ | Measured Coupling Efficiency $C_2$ | Desired Peak Reflectivity $R_{p2}$ | Chosen Fiber Bragg Grating |
|---|---|---|---|---|
| 5% | 70% | 60% | 6.8% | (6) 7% |
| 5% | 70% | 65% | 5.8% | (5) 6% |
| 5% | 70% | 70% | 5% | (3) 5% |
| 5% | 70% | 75% | 4.6% | (2) 4.5% |
| 5% | 70% | 80% | 3.8% | (1) 4% |

Thus, judiciously splicing to the pigtail fiber of each laser module a fiber bragg grating having a peak reflectivity $R_p$ that substantially maintains constant for that module the effective reflectivity $R_{eff}$ yields locking ranges with much smaller variability. Note that a undesirable effective reflectivity also typically shifts the locking range to a higher or lower temperature range, which is advantageously likewise minimized with the present inventive method.

It should be understood that the embodiments herein above are merely illustrative of the principles of the invention. Various modifications may be made by those skilled in the art which will embody the principles of the invention and fall within the spirit and the scope thereof.

What is claimed is:

1. A method for minimizing the locking range variability of a laser module housing a laser, and a fiber which receives light egressing from the laser, said laser module being designed to have a desired locking range with a fiber grating having a nominal peak reflectivity $R_{p1}$ and a nominal coupling efficiency $C_1$ between said laser and fiber, with the effective reflectivity $R_{eff}$ of said fiber and grating combination given by $C_1^2 R_{p1}$, said method comprising the steps of:

measuring the coupling efficiency $C_2$ between the laser and fiber; and attaching to said fiber a fiber grating having a peak reflectivity $R_{p2}$ so as to maintain the effective reflectivity $R_{eff}$ substantially constant with the variation in the measured coupling efficiency $C_2$ from the nominal coupling efficiency $C_1$.

2. The method of claim 1 wherein the peak reflectivity $R_{p2}$ of the fiber grating is about 1–10%.

3. The method of claim 1 wherein the measured coupling efficiency $C_2$ is about 50–80%.

4. The method of claim 1 wherein said fiber grating is a fiber bragg grating.

5. The method of claim 1 wherein said fiber includes a lens.

6. The method of claim 1 wherein the peak reflectivity $R_{p2}$ of the fiber grating is approximately given by $$R_{p2} = \left(\frac{C_1}{C_2}\right)^2 R_{p1},$$

7. The method of claim 1 wherein said laser is a Fabry-Perot type laser.

8. The method of claim 7 wherein said Fabry-Perot laser includes first and second end facets having reflectivity values of about 95–100%, and about 1–5%, respectively.

9. A method for minimizing the locking range variability of a laser module employing an external grating to stabilize lasing at a desired wavelength, said laser module housing a laser, and a fiber which receives light egressing from the laser, said laser module having a desired locking range with a grating having a nominal peak reflectivity $R_{p1}$ and a nominal coupling efficiency $C_1$ between said laser and fiber, said method comprising the steps of:

measuring the actual coupling efficiency $C_2$ between the laser and fiber;

selecting a grating having a grating peak reflectivity $R_{p2}$ which compensates for the variation in measured coupling efficiency $C_2$ from the nominal coupling efficiency $C_1$ by maintaining constant the effective reflectivity $R_{eff}$ of the fiber and grating combination so as to thereby maintain substantially constant the fraction of light coupled back into the cavity of the laser from the grating; and attaching the selected grating to said fiber.

10. The method of claim 9 wherein the peak reflectivity $R_{p2}$ of the grating is about 1–10%.

11. The method of claim 9 wherein the measured coupling efficiency $C_2$ is about 50–80%.

12. The method of claim 9 wherein said grating is a fiber bragg grating.

13. The method of claim 9 wherein said fiber includes a lens.

14. The method of claim 9 wherein the peak reflectivity $R_{p2}$ of the grating is approximately given by $$R_{p2} = \left(\frac{C_1}{C_2}\right)^2 R_{p1},$$

15. The method of claim 9 wherein said laser is a Fabry-Perot type laser.

16. The method of claim 15 wherein said Fabry-Perot laser includes first and second end facets having reflectivity values of about 95–100%, and about 1–5%, respectively.

17. A method for minimizing the locking range variability of laser modules employing gratings to stabilize lasing at a desired wavelength, said laser modules each housing a laser, and a fiber which receives light egressing from the laser, said laser modules designed to have a desired locking range with a nominal grating peak reflectivity $R_{p1}$ and a nominal coupling efficiency $C_1$ between said laser and fiber, said method comprising the steps of:

keeping an inventory of gratings with different known peak reflectivity values;

measuring the actual coupling efficiency $C_2$ between the laser and fiber for each laser module;

based on the measured coupling efficiency $C_2$, selecting from inventory a grating having a peak reflectivity closest to the desired peak reflectivity $R_{p2}$ so to compensate for variations in measured coupling efficiency $C_2$ from the nominal coupling efficiency $C_1$, wherein the desired grating peak reflectivity $R_{p2}$ is given by $$R_{p2} = \left(\frac{C_1}{C_2}\right)^2 R_{p1};$$

and attaching the selected grating to said fiber for the respective laser module.

18. The method of claim 17 wherein the inventory of grating consists of gratings having peak reflectivity values equally spaced within the reflectivity range required to keep the effective reflectivity of the fiber and grating combination substantially constant with variations in the measured coupling efficiency $C_2$ from the nominal coupling efficiency $C_1$.

19. The method of claim 17 wherein said grating is a fiber bragg grating.

20. The method of claim 17 wherein the peak reflectivity $R_{p2}$ of the grating is about 4–7%.

21. The method of claim 17 wherein the measured coupling efficiency $C_2$ is about 50–80%.

22. The method of claim 17 wherein said fiber includes a lens.

23. The method of claim 17 wherein said laser is a Fabry-Perot type laser.

24. The method of claim 23 wherein said Fabry-Perot laser includes first and second end facets having reflectivity values of about 95–100%, and about 1–5%, respectively.

* * * * *